United States Patent [19]

Imaeda et al.

[11] Patent Number: 5,919,304
[45] Date of Patent: Jul. 6, 1999

[54] METHOD AND APPARATUS FOR PRODUCING OXIDE SERIES SINGLE CRYSTALS

[75] Inventors: Minoru Imaeda; Katsuhiro Imai, both of Nagoya; Tsuguo Fukuda, Sendai, all of Japan

[73] Assignee: NGK Insulators, Ltd., Japan

[21] Appl. No.: 08/702,157

[22] Filed: Aug. 23, 1996

[30] Foreign Application Priority Data

Aug. 25, 1995 [JP] Japan .................................. 7-217513

[51] Int. Cl.$^6$ .................................................. C30B 15/08
[52] U.S. Cl. ................................ 117/16; 117/23; 117/26; 117/33; 117/209; 117/211; 117/910; 117/948
[58] Field of Search .................... 117/16, 23, 26, 117/33, 209, 211, 910, 948

[56] References Cited

FOREIGN PATENT DOCUMENTS 733 728  9/1996  European Pat. Off. .

OTHER PUBLICATIONS

Kon et al, "generation of an interface electric field during crystal growth by .mu. PD method", nippon Kessho Seicho Gakkaishi vol. 23(3) p. 269, 1996.
Uda et al., "Intrinsic LiNbO3 melt species partitioning at the congruent melt composition. III. Choice of the growth parameters for the dynamic congruent–state growth", Journal of Crystal Growth, vol. 15593/4) pp. 229–239, 1995.
Yoon et al, characterization of dislocations in a LiNbO3 single crystal grown by micro pulling down method', crystal Research Technology, vol. 29(8) pp. 1119–1122, 1994.
Yoon et al."'Growth and characterization of K3Li2–xNb5+xO15+2x micro single crystals formed by the .mu. pulling down method for blue SHG applications", Japanese Journal of Applied Physics. Part 1 vol. 33 (6a), pp. 3510–3513, 1994.
Journal of Crystal Growth, vol. 144, No. 3/04, Dec. 02,1994, pp. 201–206, XP000483659, DAE–HO Yoon et al: "Characterization of LiNbO3 Micro Single Crystals Grownth by the Micro–Pulling–Down Method".
Journal of Crystal Growth, vol. 142, No. 3/04, Sep. 02, 1994, pp. 339–343, XP000468428, Dae–Ho Yoon et al: "Crystal Growth of Dislocation–Free LiNbO3 Single Crystals by Micro Pulling Down Method".
Journal of Crystal Growth, vol. 144, No. 3/04, Dec. 02, 1994, pp. 207–212, XP000483660, Yoon D H et al: "Morphological Aspects of Potassium Lithium Niobate Crystals with Acicular Habit Grown by the Micro–Pulling Down Method".
Extended Abstracts, vol. 94/2, 1994, p. 888 XP000550905, Yoon D H et al: "Growth and SHG Properties on Potassium Lithium Niobate Micro Single Crystals for Blue Laser Applications".

*Primary Examiner*—Robert Kunemund
*Attorney, Agent, or Firm*—Wall Marjama Bilinski & Burr

[57] ABSTRACT

When producing an oxide-series single crystal by continuously pulling downwardly by $\mu$ pulling down method, the composition of the single crystal can properly and quickly controlled to continuously produce the single crystal of a constant composition by changing the pulling rate of the single crystal. Preferably, the pulling rate is 20–300 mm/hr, and the pulling rate is decreased with the proceeding of growing of the single crystal.

9 Claims, 10 Drawing Sheets

FIG_1

FIG_2

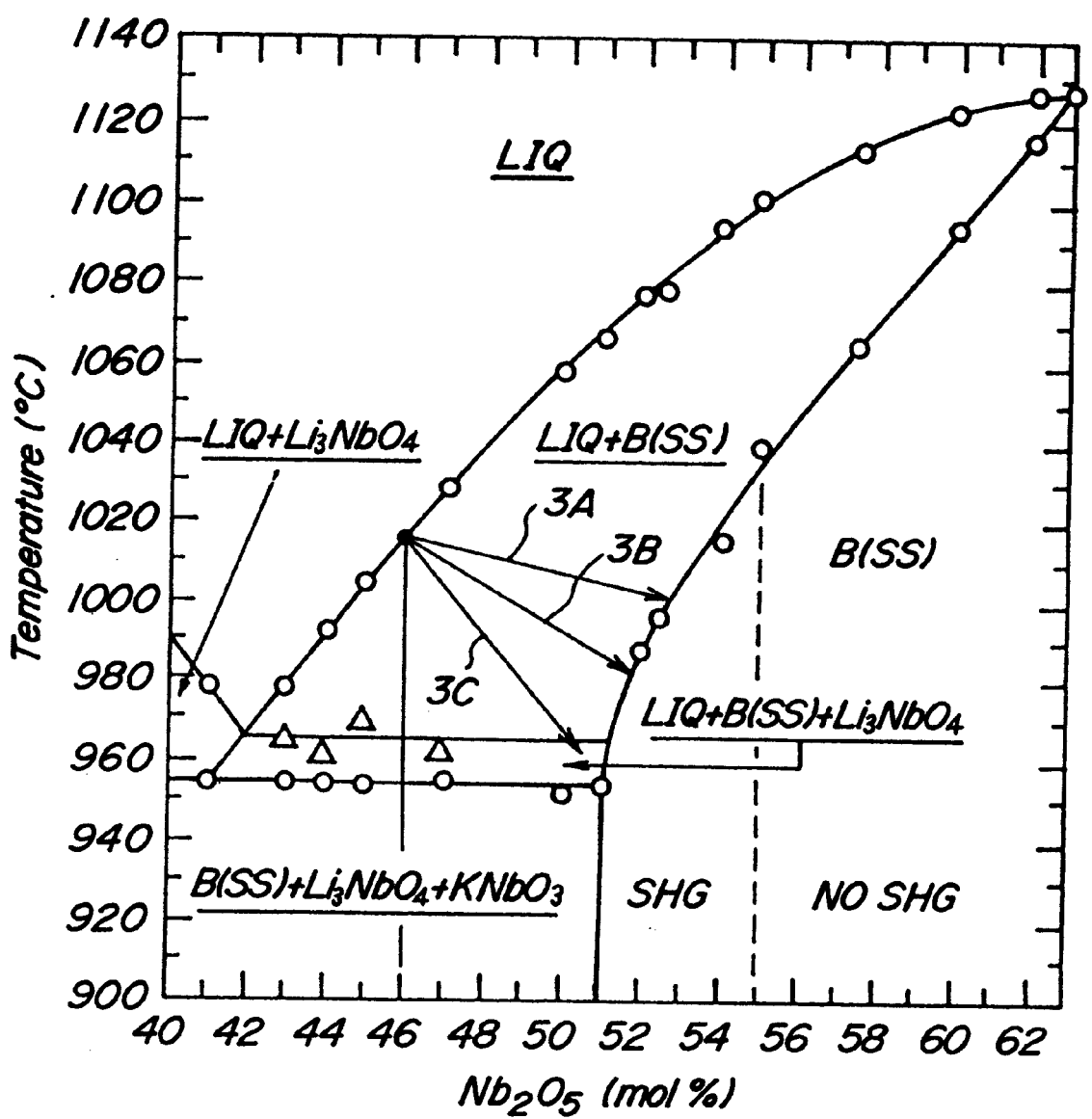
FIG_4

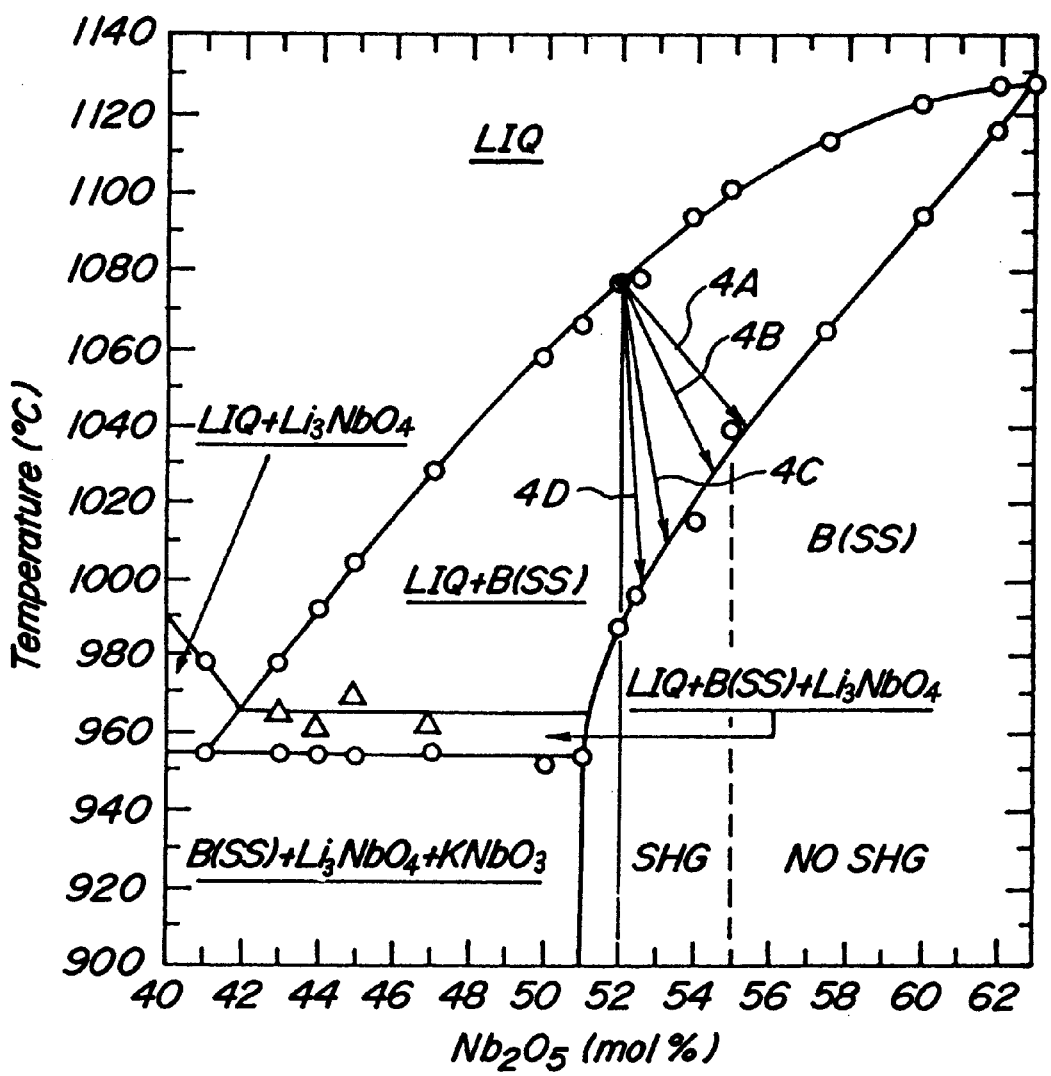
FIG_5

FIG._6
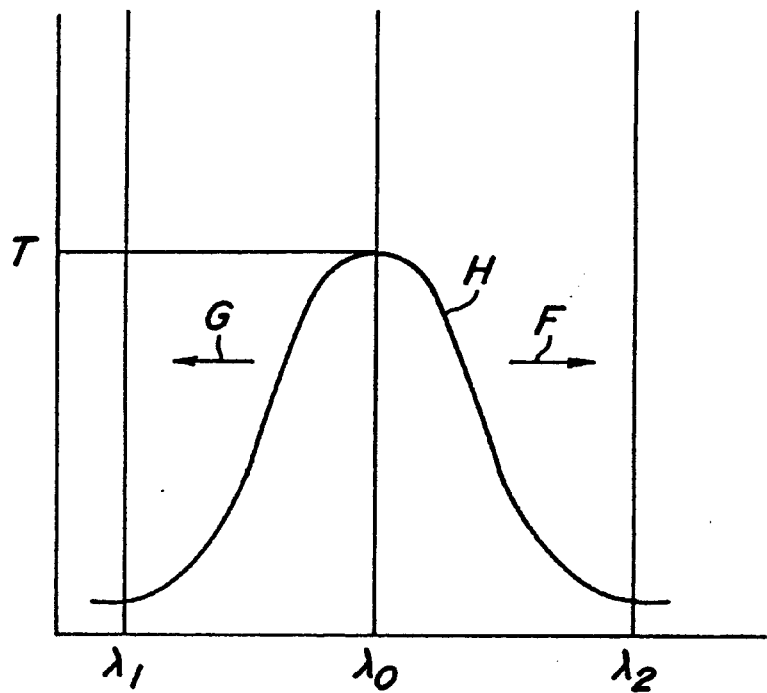
FIG._7
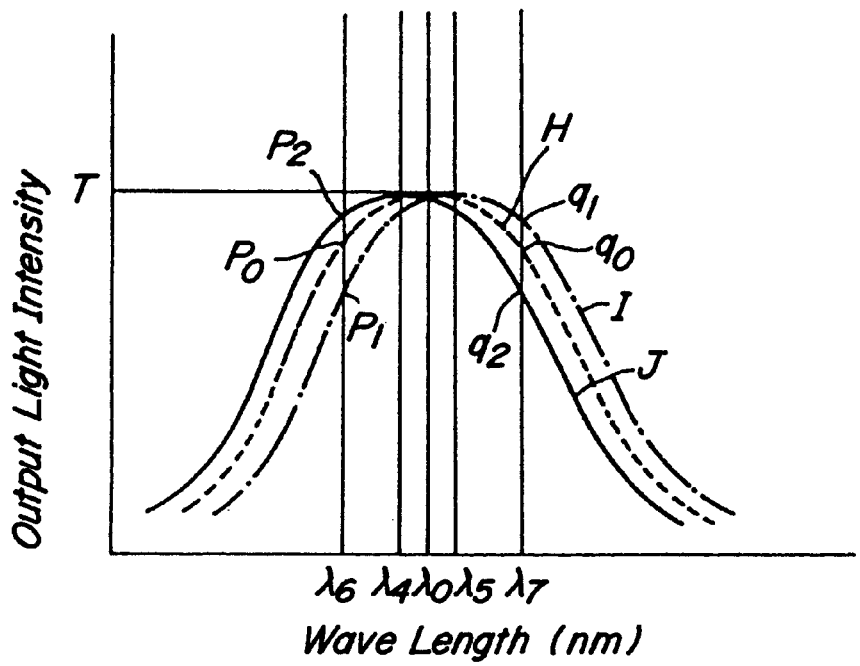

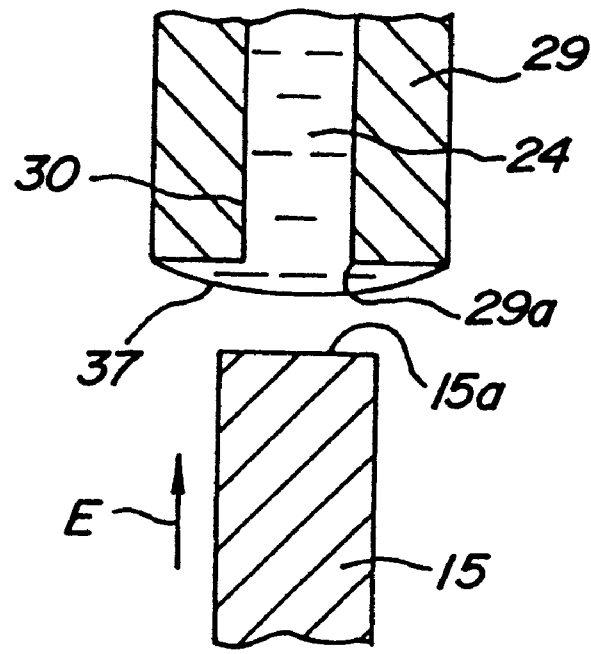
FIG._10a
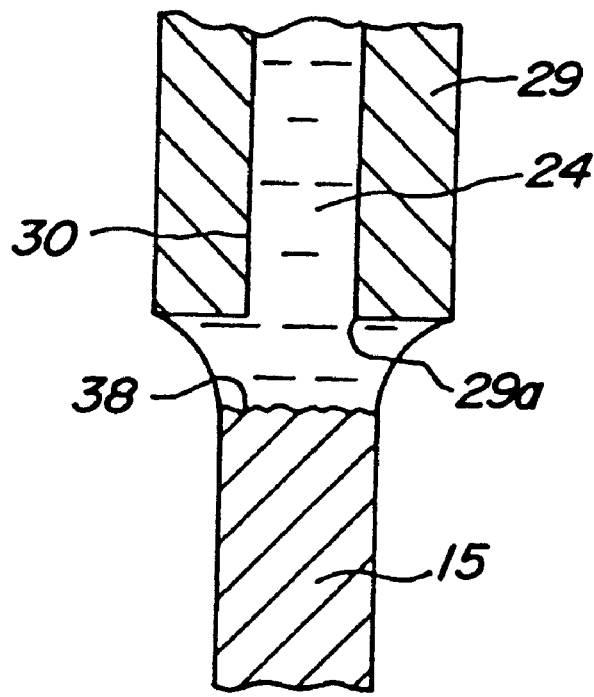
FIG._10b

FIG_11a
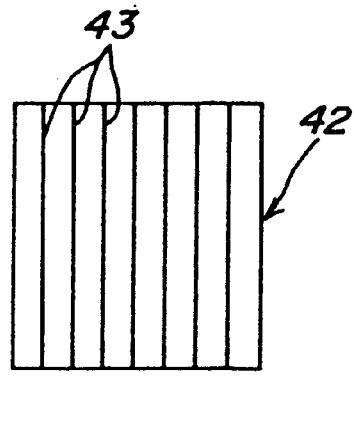
FIG_11b
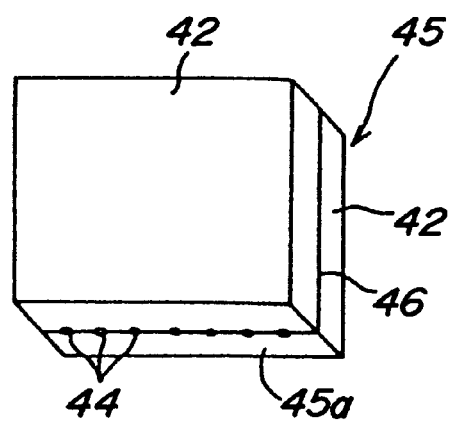
FIG_11c
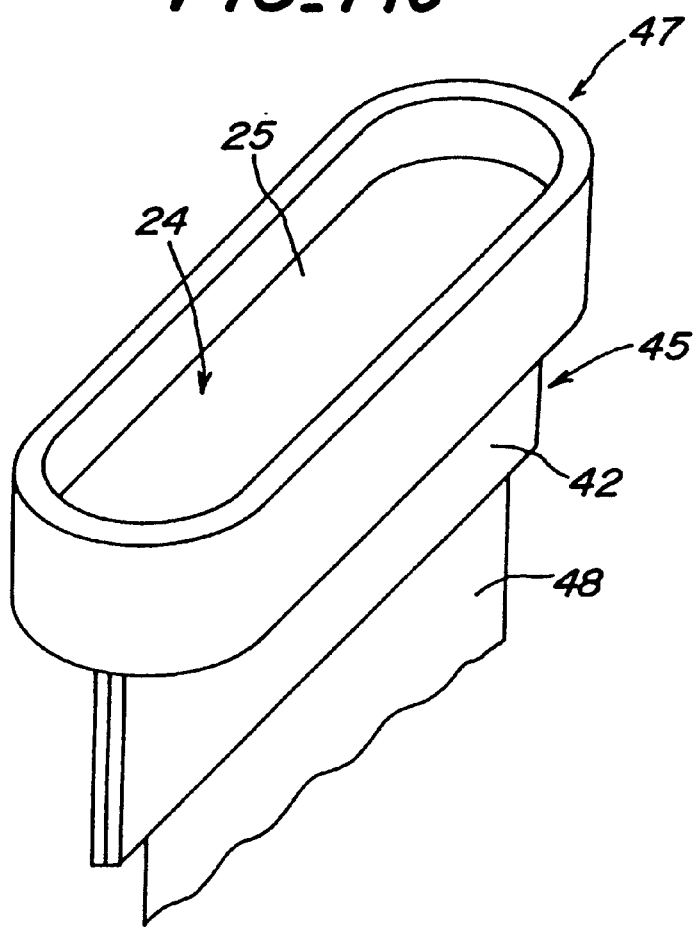

METHOD AND APPARATUS FOR PRODUCING OXIDE SERIES SINGLE CRYSTALS

BACKGROUND OF THE INVENTION

1. Field of the Invention

The present invention relates to a method and apparatus for producing oxide-series single crystals.

2. Related Art Statement

According to conventional TSSG method, when growing a KLN (potassium lithium niobate $K_3Li_{2-2x}Nb_{5+x}O_{15+x}$, hereinafter referred to as KLN) oxide or the like oxide having a composition of solid solution, single crystals of homogeneous optical properties were difficult to produce for the sake of subtle variation of composition of the growing single crystal depending on raw material composition and growing condition. Recently, as a method of growing oxide-series single crystals, a so-called "$\mu$ pulling down method" for growing single crystal fibers has attracted attentions. Details of growing single crystal fibers by the $\mu$ pulling down method were described in "DENSOUKEN News", September, [522], pp 4–8, July, 1993.

Growing of a KLN single crystal from a melt of niobium oxide, potassium carbonate and lithium carbonate and a theoretical study of a relation between the grown KLN single crystal composition and second harmonic phase-matching wavelength referring to change of lattice constants, were reported in "HIKARI GIJYUTSU KONTAKUTO (Optical and electro-optical engineering contact)", 33, [7], (1995). In the report, phase matching was attained at a wavelength of 830 nm when the single crystal has 51 mol % of niobium in the composition, while phase matching was obtained at a wavelength of 880 nm when the single crystal has 53 mol % of niobium in the composition. In this way, phase matching wavelength was shown to change depending upon the composition of the single crystal. More concretely, with the increase of niobium content by 1 mol %, SHG (second harmonic generation) phase matching wavelength was shifted to a longer wavelength side by 25 nm. Also, it was shown that, in order to control the SHG phase matching wavelength within a range of ±1.0 nm, the composition of KLN single crystal has to be controlled within a range of ±0.04 mol %.

In addition, when growing a KLN single crystal at a growing rate of about 6 mm/hr in the $\mu$ pulling down method, a tendency was observed that a phase matching wavelength of the single crystal was shifted to a shorter wavelength side with the progress of growing as reported in "the 39th JINKOU KESSYOU TOURONKAI", Oct. 17, 1994. This is considered due to the followings. As seen from the phase diagram of KLN, single crystal of a higher niobium content than that of the melt in the crucible is continuously grown, so that niobium content in the melt is gradually decreased. Accompanying with the decrease of niobium content in the melt, niobium content in the grown single crystal is decreased to shift the phase matching wavelength to a shorter wavelength side. Therefore, in the $\mu$ pulling down metbod, continuous growing of the single crystal having target optical properties, particularly a phase matching wavelength, was difficult to achieve.

Thus, when producing a material for elements for a second harmonic generation or a solid laser, a small variation of composition of the single crystal results in a noticeable variation of property of the produced single crystal to produce unacceptable products. Therefore, variation of composition of the single crystal has to be prevented as far as possible, when continuously pulling down the single crystal.

SUMMARY OF THE INVENTION

An object of the present invention is to control the composition of oxide-series single crystals when continuously producing the single crystals by the $\mu$ pulling down method.

Another object of the present invention will become apparent from the ensuing description and attached claims.

Now, the above objects can be achieved by the present invention.

The present invention is a method for producing an oxide-series single crystal including a step of continuously pulling downwardly a melt of raw material of the oxide-series single crystal from a crucible containing the melt by $\mu$ pulling down method, comprising changing the pulling rate of the oxide-series single crystal to control the composition of the single crystal.

The present invention is also an apparatus for continuously producing an oxide-series single crystal by $\mu$ pulling down method, comprising a crucible for receiving a melt of raw material of the oxide-series single crystal, a supplying device for supplying the raw material in the crucible, a driving device for variably changing the pulling rate of the melt from the crucible to form the oxide-series single crystal and growing the single crystal, an analyzing device for analyzing change of composition of the oxide-series single crystal under growing, and a treating device for changing the pulling rate of the single crystal by the driving device depending on the analyzed change of composition of the single crystal.

BRIEF DESCRIPTION OF THE DRAWINGS

For a better understanding of the present invention, reference is made to the accompanying drawings, in which:

FIG. 4 is a (K, Li)—Nb binary phase diagram showing a case of growing a single crystal from the melt of a composition having a niobium content of 46.0 mol %;

FIG. 5 is a (K, Li)—Nb binary phase diagram showing a case of growing a single crystal from the melt of a composition having a niobium content of 52.0 mol %;

FIG. 6 is a graph for illustrating an embodiment of analyzing intensities of light beams having wavelengths of $\lambda_1$–$\lambda_2$ by a spectrum analyzer;

FIG. 7 is a graph for illustrating an embodiment of measuring the intensities of light beams having wavelengths at the both sides of a target wavelength $\lambda_0$;

FIGS. 10a and 10b are respectively a schematic cross-sectional view of the lower end portion of the nozzle portion 29 of the present single crystal-producing apparatus; and FIGS. 11a, 11b and 11c are respectively a schematic graph for showing a shape of the crucible and the nozzle suitable for growing the single crystal plate.

Figure 1:
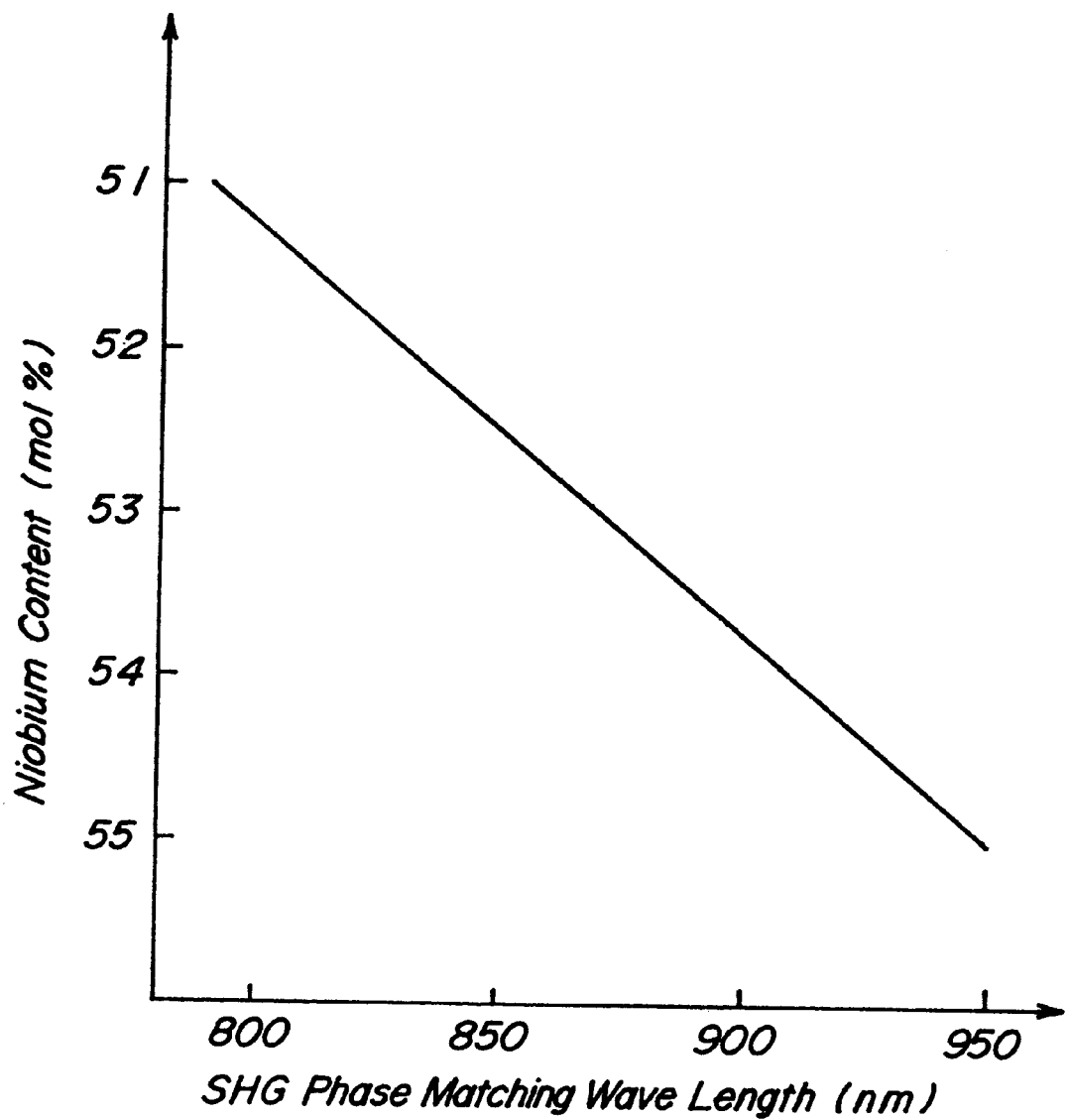
FIG. 1 is a characteristic graph showing a relation between SHG phase matching wavelength of a KLN single crystal and niobium content in the single crystal.

NUMBERING IN THE DRAWINGS 1A, 1B, 1C, 2A, 2B, 2C, 3A, 3B, 3C, 4A, 4B, 4C, 4D imaginary line for explaining a change in the composition of single crystal
5A temperature measuring device
5B temperature measuring device
5C temperature measuring device
5D temperature measuring device
5E temperature measuring device
6 camera
7 monitor
8 terminal device
9 controlling device
10 inner space
11 crucible
12 oxide-series single crystal
13 analyzing device
14 cutter
15 seed crystal
16 cutting portion
17 transferring device
18 inner space
19 raw material supplying device
19a inlet hole
20 upper furnace
21 lower furnace
22A heater
22B heater
23 analyzing device
50 single crystal

DETAILED DESCRIPTION OF THE INVENTION

The inventors have solved the above problems to succeed in continuously pulling downwardly a single crystal fiber, while maintaining the composition thereof constant. That is, the inventors have made a finding reaching to the present invention that the composition of the oxide-series single crystal can be controlled by changing the pulling rate of the single crystal at the time of continuously pulling downwardly and growing the single crystal from the melt of the raw material of the single crystal in the crucible.

More concretely explaining, a highly precise driving device for pulling downwardly the single crystal, and a furnace body which can precisely control the temperature of the single crystal, are arranged in the present growing apparatus. A platinum crucible is arranged in such a highly precise single crystal growing apparatus for growing the single crystal. If the pulling rate of the single crystal from the crucible was set in a range of 20–300 mm/hr and the temperature condition was optimized, a stable meniscus was formed at the solid phase/liquid phase interface (meniscus) to afford continuously growing of the single crystal. A relation between the pulling rate and the phase-matching wavelength of the KLN single crystal was measured to find a correlation as shown in the following Table 1.

TABLE 1

| | 45.0 | 46.0 | 47.0 | 48.0 | 48.5 | 49.0 | 49.5 | 50.0 | 50.5 | 51.0 | 51.5 | 52.0 | 53.0 | 54.0 |
|---|---|---|---|---|---|---|---|---|---|---|---|---|---|---|
| 10 | 850 | 870 | 890 | 920 | 925 | 935 | 950. | NS. | NS. | | | | | |
| 20 | 830 | 850 | 870 | 900 | 910 | 915 | 920 | 950 | NS. | NS. | | | | |
| 30 | 800 | 830 | 855 | 880 | 890 | 900 | 910 | 940 | 950 | NS. | NS. | | | |
| 40 | 780 | 810 | 840 | 860 | 870 | 880 | 900 | 920 | 940 | 950 | NS. | NS. | | |
| 50 | po. | 790 | 820 | 850 | 860 | 870 | 880 | 900 | 910 | 925 | 950 | NS. | | |
| 60 | po. | po. | 805. | 840 | 850 | 860 | 870 | 885 | 900 | 910 | 930 | 950 | | |
| 80 | po. | po. | 795. | 820 | 830 | 840 | 850 | 870 | 890 | 900 | 910 | 920 | NS. | |
| 100 | | | po. | 800 | 810 | 825 | 835 | 855 | 875 | 885 | 890 | 900 | 940 | |
| 120 | | | | 790 | 805 | 815 | 820 | 840 | 860 | 870 | 880 | 885 | 920 | |
| 140 | | | | po. | 790 | 805 | 815 | 830 | 835 | 860 | 870 | 875 | 900 | NS. |
| 160 | | | | | po. | 790 | 805 | 820 | 830 | 845 | 860 | 870 | 890 | 950 |
| 180 | | | | | | po. | 790 | 810 | 820 | 835 | 850 | 860 | 885 | 920 |
| 200 | | | | | | | po. | 805 | 810 | 815 | 840 | 850 | 880 | 910 |
| 250 | | | | | | | po. | 790 | 795. | 810 | 830 | 840 | 875 | 905 |
| 300 | | | | | | | | po. | po. | 790 | 810 | 830 | 870 | 900 |

The composition of the KLN single crystal grown as described above was analyzed. As a result, it was found that the phase matching wavelength of the KLN single crystal varies largely depending on niobium content and has a correlation therebetween as shown in FIG. 1. Though the tendency per se shown in FIG. 1 is the same as that heretofore known, the inventors have discovered that the values thereof are somewhat different from those heretofore known values. These data will be explained below. In Table 1, the abscissa expresses composition of the melt, while the ordinate expresses pulling rate. The abbreviations "po." and "NS." will be explained later.

A raw material having a typical or fundamental KLN composition of K:Li:Nb=30:20:50 mol ratio was melted, and growing of the single crystal from the melt of composition was tested. Phase matching wavelength of the KLN single crystal was 920 nm when the pulling rate was 40 mm/hr, around 870 nm when the pulling rate was 80 mm/hr and around 840 nm when the pulling rate was 120 mm/hr. It was discovered that the phase matching wavelength was shifted to the shorter wavelength side by increasing the growing rate, as seen from the above.

Next, a raw material having a KLN composition of K:Li:N=30:19.5:50.5 mol ratio was melted, and growing of the single crystal from the melt of composition was tested. As a result, phase matching wavelength of the KLN single crystal was 940 nm when the pulling rate was 40 mm/hr, around 890 nm when the pulling rate was 80 mm/hr, and around 860 nm when the pulling rate was 120 mm/hr. It was discovered that the phase matching wavelength was shifted also to the shorter wavelength side by increasing the growing rate, as seen from the above. Also, it was found that, as compared with the above fundamental composition, the phase matching wavelength was shifted to the longer wavelength side by 20 nm by increasing the niobium content by 0.5 mol %.

As seen from these results, the SHG phase matching wavelength was shifted to the longer wavelength side by 40 nm when the niobium content was increased by 1 mol %. Explaining otherwise, this indicates a necessity of controlling the composition within a range of ±0.025 mol % in order to control the SHG phase matching wavelength within a range of ±1.0 nm. This indicates a necessity of a more strict controlling of composition than that known by prior findings.

A test was made of melting a raw material of KLN of a composition of K:Li;Nb=30:20.5:49.5 mol ratio to form a melt, and growing a KLN single crystal from the melt. As a result, the phase matching wavelength of the KLN single crystal was 900 nm when the pulling rate was 40 mm/hr, around 850 nm when the pulling rate was 80 mm/hr and around 820 nm when the pulling rate was 120 mm/hr. It was discovered that the phase matching wavelength is shifted also to the shorter wavelength side by increasing the growing rate, as seen from the above. Also, it was found that, as compared with the above fundamental composition, the phase matching wavelength was shifted to the shorter wavelength side by 20 nm by decreasing the niobium content by 0.5 mol %.

Summing up these results, as regard the melt composition, the phase matching wavelength of the KLN single crystal was shifted to the longer wavelength side by 40 nm when the niobium content is increased by 1 mol %. In the vicinity of the fundamental composition, the phase matching wavelength was shifted to the shorter wavelength side by around 50 nm when the pulling rate was increased to 80 mm/hr from 40 mm/hr, and the phase matching wavelength was shifted to the shorter wavelength side by around 30 nm when the pulling rate was increased to 120 mm/hr from 80 mm/hr. The other portions of Table 1 indicates the similar meanings.

Figure 2:
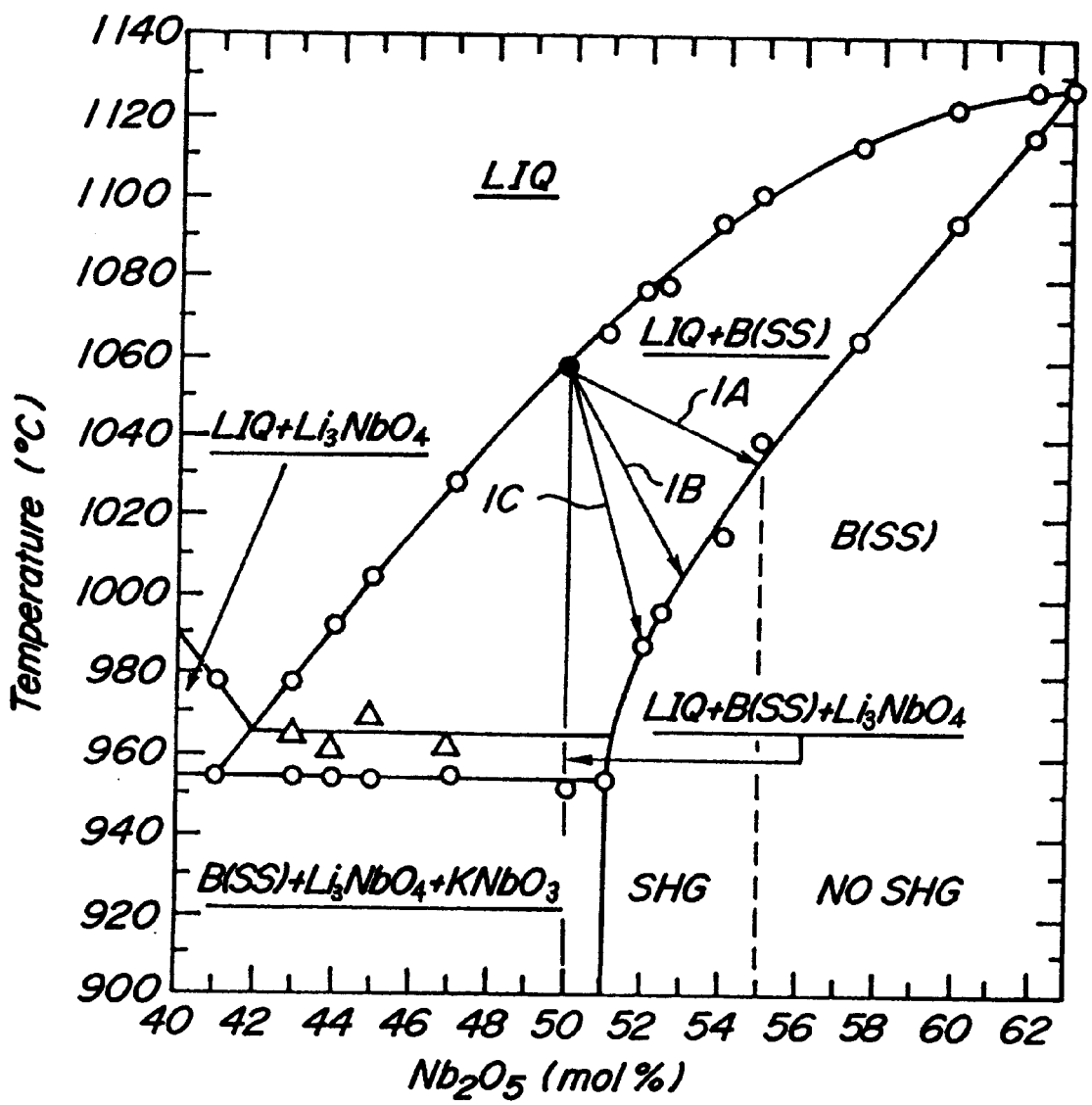
FIG. 2 is a (K, Li)—Nb binary phase diagram showing a case of growing a single crystal from the melt of a composition having a niobium content of 50.0 mol %.

The inventors presumed the reason of such a phenomenon as follows. FIG. 2 is a (K, Li)—Nb binary phase diagram showing a case of growing the single crystal from the melt of a niobium content of 50 mol %. In case of growing the oxide-series single crystal like KLN having a composition of a solid solution by $\mu$ pulling down method, composition of the oxide-series single crystal changes depending on the pulling rate of the single crystal from the melt of a composition.

For instance, at a pulling rate of 30 mm/hr the single crystal composition changes as shown by the line 1A in FIG. 2 to provide a KLN single crystal having a niobium content of 54.5 mol % and a phase matching wavelength of 940 nm. Next, if a pulling rate of 80 mm/hr is adopted, the single crystal composition changes as shown by the line 1B in FIG. 2 to provide a KLN single crystal having a niobium content of 53 mol % and a phase matching wavelength of 870 nm. The reason why the lines 1A and 1B change depending on the pulling rate is that the cooling is effected in a shorter time if the pulling rate is faster even though the compositions thereof are same, so that practical cooling rate becomes large to grow a KLN single crystal having a composition which is more close to the composition of the melt.

Therefore, the single crystal composition is influenced by the shape of the crucible, the amount of the melt, the state of the interface between the solid phase and the liquid phase and the method of controlling the state, etc. Therefore, even when the composition and the pulling rate of the melts are same, the phase matching wavelengths of the grown single crystals are observed to vary within ±10 nm. However, when a same apparatus for growing was used having the same furnace body and the same crucible shape, the variation of the phase matching wavelengths became within ±0.5 nm giving a very highly reproducible result.

If the growing rate is increased to 120 mm/hr, a single crystal is grown as shown by the line 1C in FIG. 2 having a niobium content of around 52 mol % and a phase matching wavelength of 840 nm.

Figure 3:
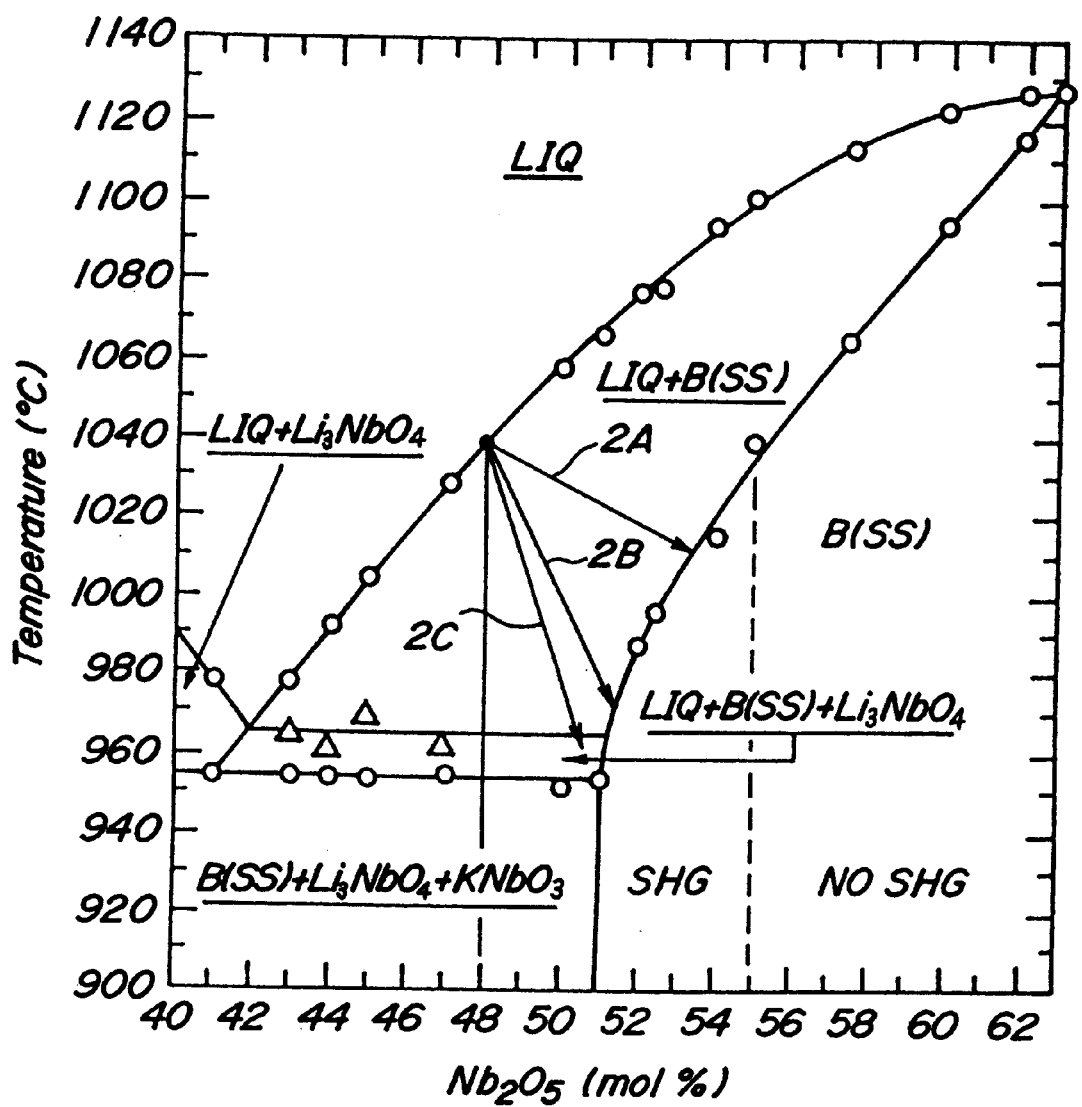
FIG. 3 is a (K, Li)—Nb binary phase diagram showing a case of growing a single crystal from the melt of a composition having a niobium content of 48.0 mol %.

FIG. 3 is a (K, Li)—Nb binary phase diagram showing a case of growing a single crystal from the melt of a niobium content of 48.0 mol %. For instance, at a pulling rate of 30 mm/hr the composition of the melt changes as shown by the line 2A in FIG. 3 to give a KLH single crystal having a niobium content of 53 mol % and a phase matching wavelength of 880 nm. Next, if a drawing rate of 80 mm/hr is adopted, the composition of the melt changes as shown by the line 2B in FIG. 3 to give a single crystal having a niobium content of around 51.5 mol % and a phase matching wavelength of 820 nm.

Until the pulling rate does not exceed 120 mm/hr, the growing of a good single crystal was possible. However, if the pulling rate exceeds 120 mm/hr, the growing of a good single crystal became impossible. This is because, at a growing rate faster than the line 2C in FIG. 3, the composition of the single crystal appears in a KLN—$Li_3NbO_4$ coexisting region so that it was polycrystallized. In the above Table 1, such a region was expressed as "po" (polycrystal).

FIG. 4 is a (K, Li)—Nb binary phase diagram showing a case of growing a single crystal from the melt of a niobium content of 46.0 mol %. For instance, at a pulling rate of less than 10 mm/hr as put into practice in the aforedescribed referential document, the composition of the melt changes as shown by the line 3A in FIG. 4 to give a KLN single crystal having a niobium content of 53 mol % and a phase matching wavelength of 870 nm. Next, if a pulling rate of 30 mm/hr is adopted, the melt composition changes as shown by the line 3B in FIG. 4 to give a single crystal having a niobium content of 52 mol % and a phase matching wavelength of 830 nm.

Until the pulling rate does not exceed 50 mm/hr, a good single crystal could be grown. However, if the pulling rate exceeds 50 mm/hr, the growing rate became faster than that shown by the line 3C in FIG. 4, and the composition appeared in a KLN—$Li_3NOb_3$ coexisting region to give a polycrystalline.

FIG. 5 is a (K, Li)—Nb binary phase diagram showing a case of growing a single crystal from the melt of a niobium content of 52.0 mol %. For instance, in the case shown by the line 4A in FIG. 5, the niobium content in the single crystal becomes 55 mol % or more, so that an orthorhombic single crystal not having an SHG activity can be obtained. In the above Table 1, such a region was expressed as "NS" (NO SHG). When a pulling rate of 80 mm/hr was adopted, the melt composition changed as shown by the line 4B in FIG. 5 to give a KLN single crystal having a niobium content of 54.5 mol % and a phase matching wavelength of 920 nm. Next, if a pulling rate of 160 mm/hr was adopted, the melt composition changed as shown by the line 4C in FIG. 5 to give a single crystal of a niobium content of 53 mol % and a phase matching wavelength of 870 nm. If a pulling rate of 300 mm/hr was adopted, a single crystal having a phase matching wavelength of 830 nm and a niobium content of 52 mol % which is substantially the same with the initial composition of the melt was obtained.

By changing the composition and drawing rate of the melt as described above, a KLN single crystal could be produced from a melt of a composition of a niobium content of 45–54 mol %. Particularly, by changing and controlling the pulling rate within a range of 10–300 mm/hr, KLN single crystals of a respective target composition can be produced and KLN single crystals having preferably an SHG phase matching wavelength can be grown.

Based on the above findings the inventors have reached to a conception of controlling the composition of oxide-series single crystals by changing the pulling rate of the single crystal at the time of continuously pulling and growing a melt of raw material of the single crystal from the crucible. By so doing, a precise controlling of the composition of the oxide-series single crystals became possible for the first time during the process of growing the oxide-series single crystals by $\mu$ pulling down method. Therefore, the present invention is very important in the technical fields necessitating mass production of the oxide-series single crystals and precise control of composition of the single crystals.

The inventors have also studied on growing of respective single crystal of KLTN namely $(K_3Li_{2-2x}(Ta_yNb_{1-y})_{5+x}]$ $O_{15+x}$, $Ba_{1-x}Sr_xNb_2O_6$, LNT namely $[LiNb_{1-x}Ta_xO_3]$, etc to obtain the similar results as described above, and found out that very satisfactory results can be obtained particularly in case of growing the single crystals of a solid solution state.

In the present invention, from the viewpoints of controllability and mass production property of the growing apparatus, a pulling rate of 20–300 mm/hr is more preferable, and a pulling rate of 50–200 mm/hr is particularly preferable. If the pulling rate is 20 mm/hr or more, the mass production property of the oxide-series single crystal becomes noticeably good, and oxide-series single crystals having a particularly good crystalline property can stably be produced by adopting a pulling rate of not more than 200 mm/hr.

PREFERRED EMBODIMENTS OF THE INVENTION

Hereinafter, the present invention will be explained with reference to preferred embodiments.

In the present invention, preferably the pulling rate of the oxide-series single crystal is so controlled that the composition of the oxide-series single crystal becomes homogeneous in the growing direction of the single crystal. As described above, with the proceeding of growing of a single crystal of a solid solution state, the composition of the melt in the crucible changes, so that the composition of the grown single crystal changes also. Therefore, the composition of the single crystal can be maintained constant by decreasing the pulling rate accompanying with the proceeding of growing of the single crystal.

In another embodiment, variation of the composition of the grown oxide-series single crystal can be prevented by continuously or intermittently supplying in the crucible a raw material having the same composition with the target composition of the oxide-series single crystal accompanying with the proceeding of growing of the oxide-series single crystal. In this case, variation of the composition of the melt in the crucible accompanying with the proceeding of growing of the oxide-series single crystal can be made relatively small. Sometimes, a noticeable change of composition of the oxide-series single crystal occurs when the raw material is charged into the melt. In such a case, the variation of the composition of the oxide-series single crystal can be prevented or minimized by changing the pulling rate depending on the noticeable change of the composition of the oxide-series single crystal.

Temperature gradient at the time of cooling the oxide-series single crystal after the growing of the single crystal is preferably not more than 1,000° C./hr. This is because occurrence of cracks in the oxide-series single crystal and deterioration of the crystallinity of the single crystal caused by thermal stress were observed, when the single crystal drawn from the growing furnace was rapidly exposed to an atmosphere of around room temperature. Therefore, as regard an annealing furnace which is attached to the lower portion of the growing furnace, a longer annealing furnace is required for a larger growing rate, so that prevention of a rapid cooling of a cooling rate of exceeding 1,000° C./hr is preferred. More preferably, the quality of the single crystal can be maintained by obtaining the single crystal under a gradual annealing of a low cooling rate of 100–400° C./hr.

Particularly effective in the present invention is to irradiate the oxide-series single crystal with a laser beam light, measure an output light beam emitted from the single crystal, and change the pulling down rate depending on the measured value. This is because, by so doing, a change of composition of the single crystal can be analyzed at real time, and the analyzed change can be fed back instantly to the pulling rate.

In this embodiment, an oxide-series single crystal for a solid laser may be used as the oxide-series single crystal, the oxide-series single crystal may be irradiated with the laser beam light to convert the wavelength of the laser beam light, and the wavelength-converted light beam may be analyzed. If the oxide-series single crystal has a second marmonic generation effect similarly as the abovementioned KLN single crystal, such an oxide-series single crystal may be irradiated with a laser beam light, and a light beam of second harmonic generation wave emitted from the single crystal may be analyzed.

Explained in more detail, shifting of the peak wavelength of the output light beam emitted from the oxide-series single crystal to the longer or shorter wavelength side indicates that the composition of the single crystal changed. Therefore, components ratio in the composition of the raw material is changed so as to decrease the shifting of the peak wavelength. By so doing, the composition of the single crystal can be maintained within a constant range, while pulling the single crystal fiber, etc. from the melt of the raw material.

As the oxide-series single crystals having the second harmonic generation effect, oxide-series single crystals, such as KLN, KLTN, KN and the like which generates a blue light beam by SHG, and oxide-series single crystals, such as CLBO, BBO, LBO and the like which generates a ultraviolet light beam, are preferred. It should be noted that the present invention is practicable even at the third harmonic generation, the fourth harmonic generation, and a higher degree of wavelength conversion. As the oxide-series single crystal of a solid solution state which can be grown by the present invention, KLN, KLTN, $Ba_{1-x}Sr_xNB_2O_6$ or the like tungsten bronze structure or Mn-Zn ferrite may be recited for example.

Particularly preferable is to irradiate the oxide-series single crystal having the second harmonic generation effect with a laser beam light, and analyze a light beam of second harmonic generation wave emitted from the single crystal.

When the laser beam light to be irradiated on the oxide-series single crystal has a wavelength range including a wavelength corresponding to a target composition, intensity of respective wavelength within a desired wavelength range can be analyzed by analyzing the output light beam emitted from the single crystal with the aid of a spectrum analyzer.

More concretely explaining with reference to FIG. 6, assuming that the output light beam corresponding to a target composition has a wavelength $\lambda_0$, and the laser beam light includes light beams ranging between wavelengths $\lambda_1$ and $\lambda_2$. Intensity of the laser beam lights having a wavelength between the wavelength $\lambda_1$ and the wavelength $\lambda_2$ is analyzed by a spectrum analyzer. If the oxide-series single crystal pulled down from the drawing hole of the crucible has a target composition, the laser beam light has a maximum intensity T at the wavelength $\lambda_0$. However, with the proceeding of the production of the single crystal, the thermal state and the influence of gravity force, etc., at the vicinity of the drawing hole of the oxide-series single crystal are subtly changed to slightly shift the peak wavelength toward the wavelength $\lambda_1$ or $\lambda_2$. Accompanying thereto the whole of curve H is slightly shifted in a direction as shown by the arrow F or G in FIG. 6. If the composition of the melt changes, the peak wavelength is noticeably removed.

Therefore, in the process of pulling downwardly the oxide-series single crystal, if the peak wavelength of the output light beam change, the change of the peak wavelength can immediately be analyzed and the analyzed value can be fed back to the driving device for pulling the single crystal and if desired to the supplying device for the raw material.

If the light-receiving device or analyzer is a device like a photodiode which cannot analyze distribution of the wavelength of the components of the output light beam, the intensities of the respective wavelength of the output light beam cannot directly be analyzed. Therefore, a preferable monitoring method in such a case will be explained below with reference to FIG. 7.

A wavelength $\lambda_0$ of an output light beam corresponding to a target composition is assumed. If the oxide-series single crystal pulled down from the drawing hole of the crucible has a target composition, the laser beam light has a maximum intensity T at the wavelength $\lambda_0$. With the proceeding of the production of the single crystal, the peak wavelength $\lambda_0$ is shifted as described above to a wavelength $\lambda_4$ or $\lambda_5$. Accompanying thereto the whole of curve H is removed to rightward or leftward to become a curve I or J.

The whole shape of the curve H has usually a very small inclination in the vicinity of the peak wavelength $\lambda_0$. Therefore, if the peak wavelength is slightly shifted, the change of the output light beam intensity is further very small, so that analysis of the change of composition is practically difficult.

Thus, a first laser beam light having a wavelength $2\lambda_7$ larger than a wavelength $2\lambda_0$ and a second laser beam light having a wavelength $2\lambda_6$ smaller than the wavelength $2\lambda_0$ are irradiated on the oxide-series single crystal, and a light beam-receiving device was arranged which measure the intensity of the output light beams emitted from the single crystal corresponding to the respective laser beam light. Intensity of the output light beams corresponding to the first laser beam, and intensity of the output light beam corresponding to the second laser beam, were analyzed.

As a result, when the oxide-series single crystal pulled downwardly from the drawing hole of the crucible has a target composition, the intensity of the output light beam at the wavelength $\lambda_6$ becomes $p_0$, and the intensity at the wavelength $\lambda_7$ becomes $q_0$. Accompanying with the proceeding of the production of the single crystal, if the peak wavelength $\lambda_0$ is shifted to $\lambda_5$, the curve H is removed rightward to become a graph I. At that time, the intensity at the wavelength $\lambda_6$ becomes $p_1$ which is a decreased value and smaller than $p_0$. Meanwhile, the intensity at the wavelength $\lambda_7$ becomes $q_1$ which is an increased value and larger than $q_0$. In contrast, if the peak wavelength $\lambda_0$ is shifted to $\lambda_4$, the curve H is removed leftward to become a graph J. At that time, the intensity at the wavelength $\lambda_6$ becomes $P_2$ which is an increased value and larger than $p_0$. Meanwhile, the intensity at the wavelength $\lambda_6$ becomes $p_2$ which is a decreased value and smaller than $q_o$.

In this way, the increase of the intensity and the decrease of the intensity of the output light beam appear as a pair at the both side of the peak wavelength, so that extremely good sensitivity to the change of composition can be attained. In addition, particularly by selectively adopting a wavelength for measuring at the outer (shorter or longer) wavelength side of the peak wavelengths $\lambda_0$, $\lambda_4$ and $\lambda_5$ while avoiding the vicinity of the peak wavelength $\lambda_0$, $\lambda_4$ and $\lambda_5$, the sensitivity can further be improved from this viewpoint also.

In the above method, the first laser beam light and the second laser beam light may be irradiated on the single crystal simultaneously. Alternatively, a respective laser beam light of two types of wavelength may be sequentially irradiated on the single crystal at a determined time interval by using a wavelength-variable laser.

Hereinafter, the present invention will be explained further with reference to preferred embodiments. The inventors have made studies on enlarging the crucible for receiving the melt of the material of the oxide-series single crystal in order to establish a mass production technique of the single crystal by mans of $\mu$ pulling down method. During the process, the inventors made a test of adopting a larger size of crucible, providing a lower extending nozzle portion on the crucible, arranging a single crystal growing portion at the lowermost opening end of the nozzle portion, and independently controlling the temperatures of the crucible and the single crystal growing portion.

As a result, the inventors have found out that the oxide-series single crystal can easily be pulled downwardly continuously even when the amount of the raw material powder to be melted in the crucible is a large amount of at least 5 g and a large crucible of a large capacity corresponding to the large amount of the material powder is used.

The reason why such splendid function and effect were obtained is considered presumably due to that the single crystal growing portion becomes difficult to directly be influenced by the heat amount generated by the melt in the crucible by virtue of providing the single crystal growing portion at the lower opening end of the nozzle portion, and that the temperature gradient in the vicinity of the single crystal growing portion can be made large by the independent temperature control of the crucible and the single crystal growing portion or the nozzle portion.

Moreover, the inventors have discovered that, according to this method, even when the amount of the raw material powder to be melted in the crucible is increased to around 30–50 g, variation of the composition of the grown KLN single crystal fiber can be reduced to a surprisingly high precision of not more than only 0.01 mol %. Therefore, by combining such a method and the present invention, the oxide-series single crystals of such a very high precision can be mass produced.

The inventors have made further studies on the state of the melt and physical properties of the single crystal at the single crystal growing portion by using the aforedescribed producing apparatus. As a result, the inventors have found out that a good oxide-series single crystal of an extremely low variation of composition can continuously be pulled down, when the surface tension is dominant than gravity force in the environment of the single crystal growing portion. This is considered due to formation of a good interface between the solid phase and the liquid phase in such a case.

As explained before, in order to form a condition that the surface tension is more dominant than the gravity force in the single crystal growing portion, provision of a mechanism of decreasing the gravity force acting on the melt in the crucible of the nozzle portion is effective. The inventors made studies on such a mechanism to find out that such a condition that the surface tension is more dominant than the gravity force acting on the melt can be produced in the nozzle portion to form a uniform meniscus at the lowermost opening end of the nozzle portion, particularly by using the nozzle portion having an inner diameter of not more than 0.5 mm.

However, if the nozzle portion has an inner diameter of less than 0.01 mm, the growing rate of the single crystal becomes too small. Therefore, from the view point of mass production the nozzle portion has preferably an inner diameter of at least 0.01 mm. Most optimum inner diameter of the nozzle portion is in a range of 0.01–0.5 mm and slightly varies in the range depending on viscosity, surface tension and specific gravity of the melt and growing rate of the single crystal, etc.

The inventors made further studies on this point to obtain the following finding. Namely, according to the conventional $\mu$ pulling down method, a small size of crucible was used, so that a single crystal fiber could be pulled downwardly continuously, and this is considered presumably due to a small amount of melt in the crucible and the melt was adhered on the inner wall surface of the crucible by its surface tension so that a somewhat uniform interface between the solid phase and the liquid phase was formed, while the condition that the surface tension is more dominant than the gravity force in the vicinity of the drawing hole was lost by increasing the size of crucible.

Furthermore, according to this method, the temperature gradient in the single crystal growing portion and in the vicinity thereof viewed in the length direction of the nozzle portion can easily be made large. By so doing, the melt flowed down in the nozzle portion can rapidly be cooled.

When the raw material is supplied to the melt in the crucible, the thermal state of the melt in the crucible is changed by the heat of dissolution of the supplied raw material to change the composition, etc., of the grown single crystal. However, by the provision of the nozzle portion below the crucible as described above, the raw material can continuously or intermittently be supplied to the melt in the crucible, because even when the aforedescribed thermal change occurs in the melt in the crucible, thermal influence on the single crystal growing portion is small and the single crystal growing portion is more hardly influenced by the thermal change because it is not in an equilibrium state but in a kinetic state.

In the present invention, the method for heating the crucible is not specifically limited. However, preferably a heating furnace is provided so as to surround the single crystal producing apparatus. At that time, preferably the heating furnace is divided into an upper furnace and a lower furnace, the crucible is surrounded by the upper furnace and the upper furnace is heat generated to a relatively high temperature to assist the melting of the raw material powder in the crucible. On the other hand, preferably the lower furnace is arranged around the nozzle portion and the lower furnace is heat generated to a relatively lower temperature so as to make the temperature gradient large in the single crystal growing portion at the lowermost opening end of the nozzle portion.

In addition, in order to improve the melting efficiency of the raw material powder in the crucible, preferably the crucible itself is made of an electrically conductive material and heat generated by supplying electric power thereto, instead of heating the crucible exclusively by the outer heating furnace. In addition, in order to maintain the molten state of the melt flowing in the nozzle portion, preferably the nozzle portion is made of an electrically conductive material and heat generated by supplying electric power thereto.

As such an electrically conductive material, platinum, platinum-gold alloys, platinum-rhodium alloys, platinum-iridium alloys, and iridium are preferred particularly from the aspect of corrosion-resistant property.

The present invention is satisfactorily applicable not only to the production of oxide-series single crystal fibers, but also to the production of planar or plate shaped single crystal. Concrete method of producing single crystal plate will be explained later.

KLN single crystals have recently attracted attentions as optical materials, particularly as the single crystal for a blue second harmonic generation (SHG) elements for use with a semiconductor laser. Because it can generate an ultraviolet ray until the region of 390 nm, it can be applied over a wide range of use including optical disc memory use, medical use, photochemical use, and various optical measuremental uses, etc. In addition, KLN single crystals have large opto-electrical effects, so that they are applicable also to optical memory elements and the like using the photorefractive effects.

Figure 8:
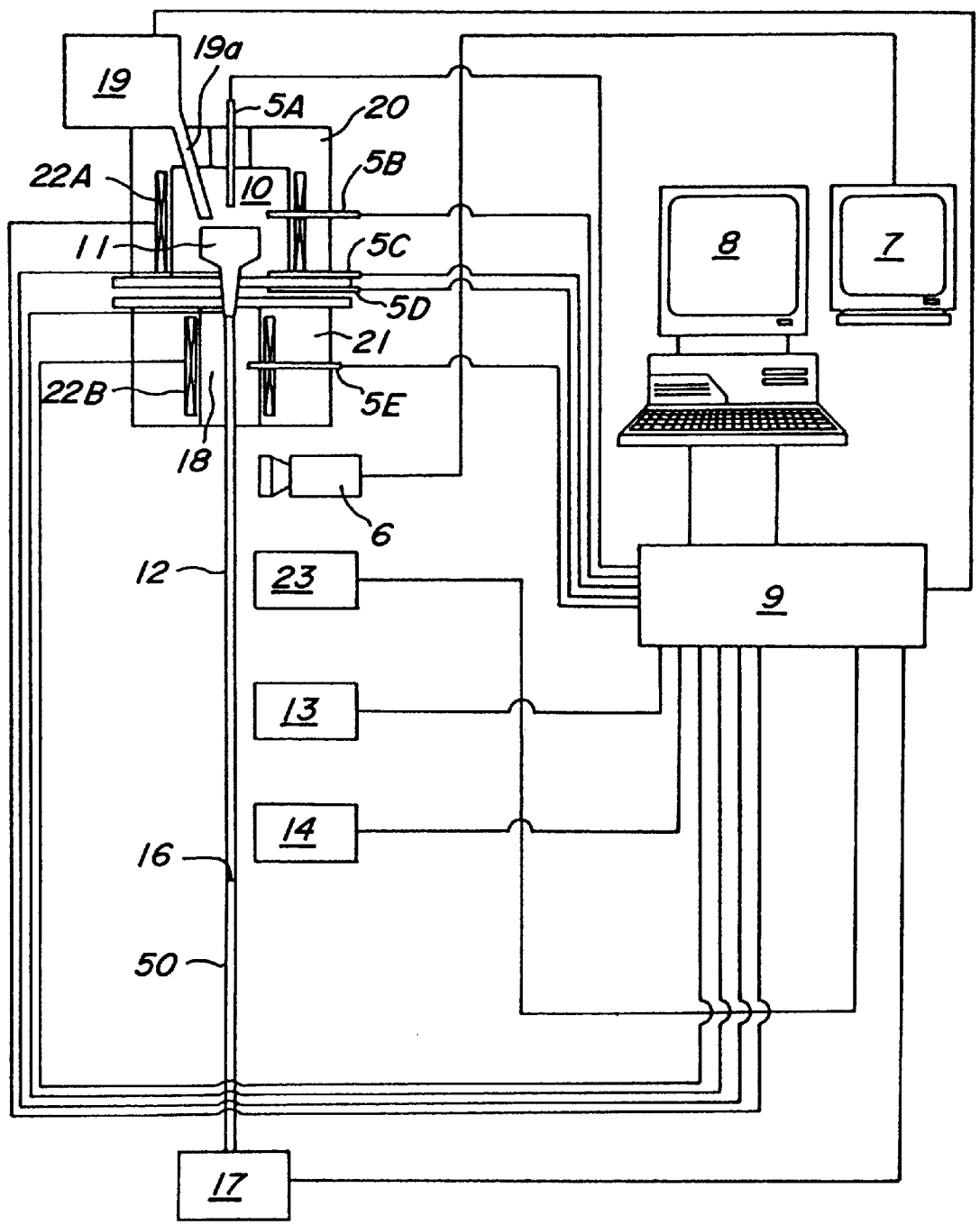
FIG. 8 is a schematic block diagram showing an embodiment of the single crystal producing apparatus according to the present invention.

FIG. 8 is a schematic block diagram of an embodiment of the producing apparatus according to the present invention. In the producing apparatus, a heater 22A is arranged in the upper furnace 20 and a heater 22B is arranged in the lower furnace 21. Temperature measuring devices preferably thermocouples 5A, 5B, 5C 5D, 5E are arranged at desired portions of the upper and lower furnaces 20, 21. The respective temperature measuring device is connected to a controlling device through communicating wires. The crucible 11 is arranged in an inner space 10 of the upper furnace 20 and an oxide series single crystal is pulled down from a lower nozzle of the crucible 11 to an inner space 18 of the lower furnace 21. Preferable embodiment of these portions will concretely be described later. The raw material supplying device 19 is arranged above the upper furnace 20 with the supplying hole 19a opening toward the upper surface of the crucible 11. The raw material supplying device 19 is also connected to the controlling device 9.

A camera 6 for taking a photograph of a single crystal 12 is arranged below the lower furnace 21 and the camera 6 is connected to a monitor 7. A driving device 23 schematically shown as a block is arranged below the camera 6, and an analyzing device 13 for analyzing the composition of the single crystal and a cutter device 14 are arranged below the driving device 23. The driving device 23, the analyzing device 13 and the cutter 14 are connected to the controlling device 9. Pulling rate by means of the driving device 23 is precisely controlled by the controlling device 9. Reference numeral 16 is a cutting point, and reference numeral 50 is a single crystal product having a desired shape and size obtained by the cutting.

A transferring device is arranged below the cutting point to receive and transfer the single crystal product 50. The controlling device 9 is constructed so as to be monitored and controlled by a terminal device 8.

Figure 9:
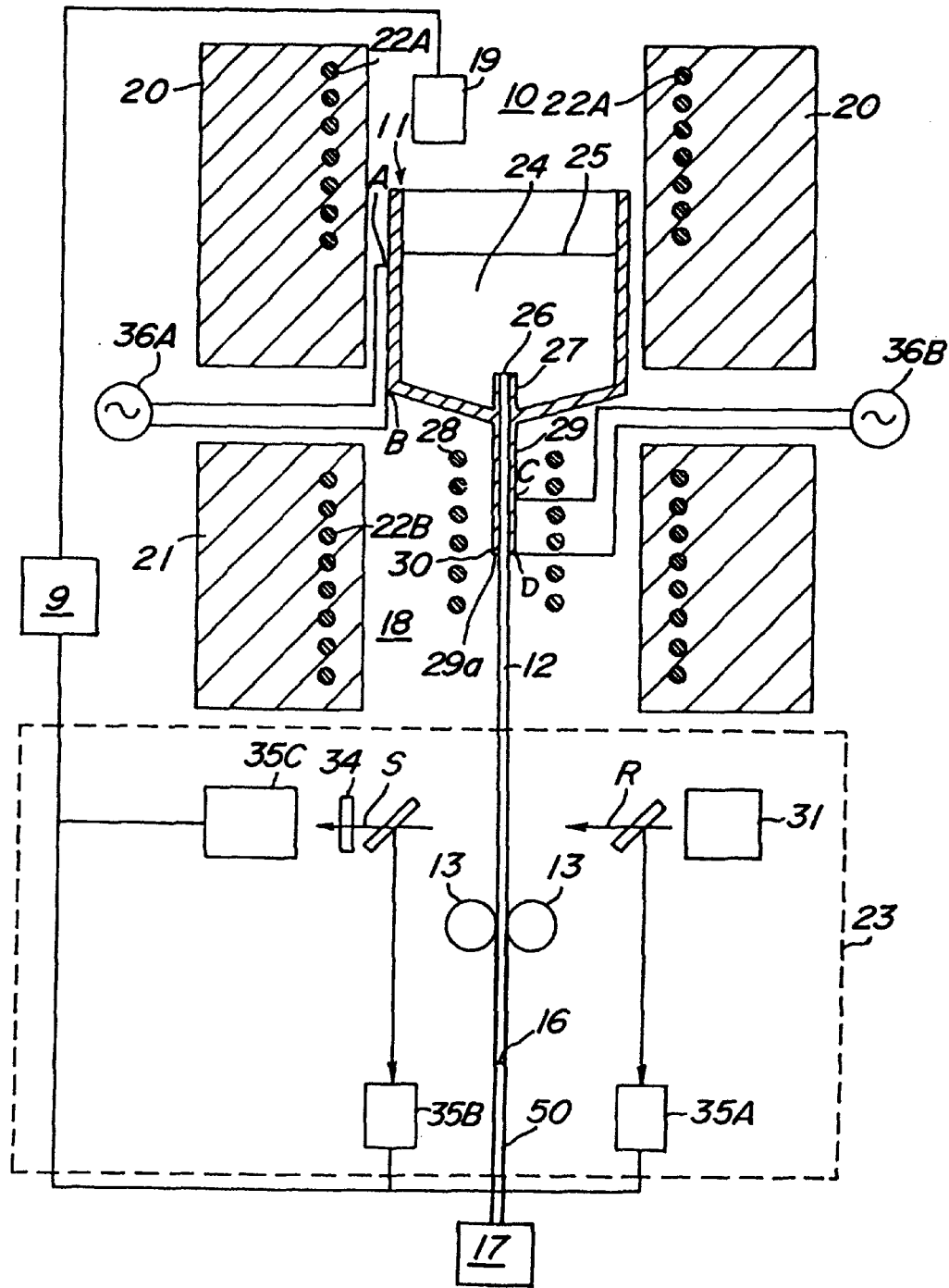
FIG. 9 is a schematic block diagram of an embodiment of the single crystal growing apparatus according to the present invention.

FIG. 9 is a schematic cross-sectional view of an embodiment of the single crystal producing apparatus according to the present invention, and FIGS. 10a, 10b are schematic cross-sectional views respectively illustrating the state of the lowermost opening end of the nozzle portion thereof.

The crucible 11 is arranged in the interior of the furnace body. The upper furnace 20 is arranged so as to surround the crucible 11 and its upper space 10, and the heater 22A is embedded within the upper furnace 20. The nozzle portion 29 is extending downwardly from the lower end portion of the crucible 11 and the nozzle portion 29 has an opening 29a at its lower end. The lower furnace 21 is arranged so as to surround the nozzle portion 29 and its surrounding space 18, and the heater 22B is embedded in the lower furnace 21. The shape itself of such heating furnaces can be varied variously. For example, though the heating furnace is shown divided into two zones in FIG. 9, it may be divided into at least three zones. The crucible 11 and the nozzle portion 29 are respectively made of a corrosion resistant electrically conductive material.

An electrode of an electric power source 36A is connected to the crucible 11 at a portion A through an electric wire, and the other electrode of the power source 36 is connected to a lower bent portion B of the crucible 11 through an electric wire. An electrode of an electric power source 36B is connected to a portion C of the nozzle portion 29 through an electric wire, and the other electrode of the power source 36B is electrically connected to a lower end D of the nozzle portion 29. These electric power supplying mechanisms are separated from each other and constructed to independently control their voltages.

An after heater 28 is arranged in the space 18 so as to surround the nozzle portion 29 with a spacing therefrom. An inlet pipe 27 is provided in the crucible 11 so as to extend upwardly with an inlet hole 26 at the upper end which is protruded slightly from the bottom of the crucible 11.

Temperature distributions in the spaces 10, 18 are properly determined by heat generating the upper furnace 20, the lower furnace 21 and the after heater 28, a raw material for the melt is supplied in the crucible 11, and the crucible 11 and the nozzle portion 29 are heat generated by supplying electric power thereto. At such a state, in a single crystal growing portion 30 existing at the lower end of the nozzle portion 30, the melt 24 is slightly protruding from the lower opening 29a and held thereat by its surface tension to form a relatively flat surface 37, as shown by FIG. 10a.

The gravity force acting on the melt 24 in the nozzle portion 29 is largely decreased by the contact of the melt 29 with the inner wall surface of the nozzle portion 29. Particularly, by using the nozzle portion 29 of an inner diameter of not more than 0.5 mm, the aforedescribed uniform interface between the solid phase and the liquid phase could be formed.

At this state, a seed crystal 15 is moved upwardly as shown by the arrow E in FIG. 10a to cause an upper end surface 15a thereof to contact with the surface 37. Then, the seed crystal 15 is pulled downwardly as shown by FIG. 10b. At that time, a uniform meniscus 38 is formed between the upper end of the seed crystal 15 and the lower end of the melt 24 which is pulled downwardly from the nozzle portion 29.

As a result, a single crystal 12 is continuously formed on the upper side of the seed crystal and pulled downwardly, as shown in FIG. 9. In this embodiment, the single crystal 12 is fed by rollers 13 which functions as a driving device.

On the other hand, when an increased amount of the raw material powder was supplied in a conventional crucible, a downwardly expanded portion of the melt is formed at the drawing hole of the crucible 11. If the lower end surface 15a of the seed crystal 15 is contacted with the melt at this state, a good and uniform meniscus cannot be formed.

The single crystal 12 is continuously pulled downwardly and then irradiated in the analyzing device 23 by a laser beam light of a wavelength of around $2\lambda_0$ from a laser beam source 31 as shown by the arrow R in FIG. 9, and the output light beam S of a wavelength of around the second harmonic generation $\lambda_0$ emitted from the single crystal 12 is received by a light beam-receiving device 35C through a long wavelength cut filter 34 to detect its intensity. Light beams split from the laser beam source 31 are irradiated to light beam-receiving devices 35A, 35B for emitting signals therefrom. Signals from the light beam-receiving devices 35A, 35B, 35C are transmitted to the controlling device 9 and treated therein. By controlling the pulling rate of the single crystal by the driving device and controlling the components ratio of the raw material to be charged in the crucible 11 from an upper raw material supplying device 19 with the aid of the treatment in the device 9, a feed back controlling is effected to offset the variation of the composition of the oxide-series single crystal.

Next, a preferred embodiment of concrete shape of the nozzle portion for producing a single crystal plate will be explained. A plural rows of elongated fine grooves 43 are formed in a flat plate 42 so as to be parallel to each other, as shown in FIG. 11a. The flat plates 42 are adhered to each other to form a planar shaped nozzle portion 45 and a plural rows of passage holes 44 formed in the nozzle portion 45, as shown in FIG. 11b. Reference numeral 46 is a seam of the flat sheets 42.

The nozzle portion 45 is joined to the bottom portion of a substantially rectangular crucible 47, as shown in FIG. 11c. The melt in the crucible 47 flows down through the passages 44 and flows out from the lower end opening thereof. At that time, each melt flowed out from the respective passage 44 becomes integral and flows on the bottom surface 45a of the nozzle portion 45 to become a solid phase at immediate below the bottom surface 45a thereby to allow a plate shaped single crystal 48 to be pulled downwardly of the nozzle portion 45. In this way, a nozzle portion of a small inner diameter for forming a single crystal plate can easily be produced.

Hereinafter, the present invention will be explained with reference to producing examples using concrete experimental results.

EXAMPLE 1

Structure of the Furnace Body Portion of the Single Crystal Growing Furnace

A KLN single crystal was grown using a growing device of a structure as shown in FIGS. 8 and 9. A raw material powder was prepared by mixing potassium carbonate, lithium carbonate and niobium oxide in a molar ration of 30:20:50, and about 300 g of the raw material powder was put in a platinum crucible. The furnace body portion of the single crystal growing furnace has the upper furnace and lower furnaces which control the temperature of the entire furnace as described above, and the portions of supplying electric power to the nozzle portion and the after heater for controlling the temperature gradient around the growing point of the single crystal.

The upper furnace portion was adjusted to a temperature of 1,100–1,200° C. to melt the raw material powder in the platinum crucible. The lower furnace portion was controlled to a uniform temperature of 500–1,000° C. In addition, the temperature of the single crystal growing point was optimized by supplying electric power to the nozzle portion of the crucible and the after heater to perform the growing of the single crystal. The growing condition was controlled so that a good single crystal can be grown. That is, the growing point was controlled to a temperature of 1,050–1,150° C. and a temperature gradient of 10–50° C./mm to perform the growing of the single crystal.

Start of Growing

A driving device comprising a mechanism portion for holding and moving the seed single crystal, and a mechanism portion for holding and moving the grown oxide-series single crystal by means of rollers, was used, as the mechanism of moving the single crystals.

As the cutter device, a mechanism was mounted of locally heating and melting the single crystal by a carbon dioxide gas laser beam. The driving mechanism for pulling downwardly the single crystal was constructed to have a uniform pulling rate of 2–300 mm/hr viewed in the vertical direction. As the transferring device, belt conveyor for transferring the oxide-series single crystal was used.

At the time of seeding, the seed crystal was contacted to the substantially flat lower surface of the melt at the lower end of the nozzle portion to obtain an optimum meniscus state, and the single crystal was grown at a constant rate of 80 mm/ hr. When the thus grown single crystal having a cross-section of a size of 1 mm×1 mm reached to a length of about 200 mm, the single crystal was held at the both sides by rollers for continuous transferring and the transferred.

Control at the Time of Growing

With the proceeding of the growth of the single crystal, a KLN single crystal of a niobium content of 53 mol % was grown, so that the niobium content of the melt in the crucible was gradually decreased from 50 mol % to 49.5 mol % and then to 49.0 mol %. Therefor, the abovementioned analyzing device was used and a titanium sapphire laser beam or a semiconductor laser beam was used to monitor the phase matching wavelength of the output light beam emitted from the KLN single crystal, and the pulling rate was gradually decreased from 80 mm/hr to 65 mm/hr and then to 50 mm/hr. As a result, about 100 strings of KLN single crystal fiber could be produced in 10 days.

Measurement of Properties as SHG Element

All the thus grown KLN single crystal fibers were measured the wavelength of second harmonic generation. As a result, the phase matching wavelength was found to exist within a range of ±0.2 nm for a target wavelength of 870 nm. The output light beam transforming efficiency was found to be substantially the same with the theoretical value, and the variation of the output light beam was within a ±1% or less, which is smaller than detectable limit.

EXAMPLE 2

Structure of the Furnace Body Portion of the Single Crystal Growing Portion

A KLN single crystal was grown using a growing device of a structure as shown in FIGS. 8 and 9. A raw material powder was prepared by mixing potassium carbonate, lithium carbonate and niobium oxide in a molar ration of 30:20:50, and about 2000 g of the raw material powder was put in a platinum crucible. A device for supplying the raw material powder was arranged above the crucible, and a structure was adopted of controlling the supply of the raw material powder with the aid of a signal expressing a temperature change and emitted from a thermocouple arranged to contact with the melt surface. The crucible has the shape shown in FIGS. 11a–11c.

The furnace body portion of the single crystal growing furnace has the upper and lower furnaces which control the temperature of t he entire furnace as described above, and the portions of supplying electric power to the nozzle portion and the after heater for controlling the temperature gradient in the vicinity of the growing point of the single crystal.

The upper furnace portion was adjusted to a temperature of 1,100–1,200° C. to melt the raw material powder in the platinum crucible. The lower furnace portion was controlled to a uniform temperature of 500–1,000° C. In addition, the temperature of the single crystal growing point was optimized by supplying electric power to the nozzle portion of the crucible and the after heater to perform the growing of the single crystal. The growing condition was controlled so that a good single crystal can be grown. That is, the growing point was controlled to a temperature of 1,050–1,150° C. and a temperature gradient of 10–50° C./mm to perform the growing of the single crystal.

A driving device comprising a mechanism portion for holding and moving the seed single crystal, and a mechanism portion for holding and moving the grown oxide-series single crystal by means of rollers, was used, as the mechanism of moving the single crystals.

As the cutter device, a mechanism was mounted of locally heating and melting the single crystal by a carbon dioxide gas laser beam. The driving mechanism for pulling downwardly the single crystal was constructed to have a uniform pulling rate of 2–300 mm/hr viewed in the vertical direction. As the transferring device, belt conveyor for transferring the oxide-series single crystal was used.

At the time of seeding, the seed crystal was contacted to the substantially flat lower surface of the melt at the lower end of the nozzle portion to obtain an optimum meniscus state, and the single crystal was grown at a constant rate of 80 mm/ hr. When the thus grown single crystal having a cross-section of a size of 50 mm×1 mm reached to a length of about 200 mm, the single crystal was held at the both sides by rollers for continuous transferring and the transferred. Also, a monitor was arranged which monitors and detects the thickness of the single crystal plate by means of a semiconductor laser beam light.

Control at the Time of Growing

With the proceeding of the growing of the single crystal, the melt in the crucible is gradually consumed as the single crystal plate, so that the weight of the melt is gradually decreased. With the decrease of the amount of the melt, the position or level of the surface of the melt changes usually. However, the change of the melt surface was detected by a thermocouple, and the raw material powder was supplied to the crucible so that the weight of the raw material in the crucible could be maintained within a constant range. Though the change of the amount of the melt in the crucible was detected by the thermocouple in this example, a total weight of the melt including the crucible may be detected by a load cell, and the raw material powder may intermittently be supplied to the crucible so that the variation of the total weight becomes within a range of ±1 g. The raw material powder had a same composition with the composition of a grown single crystal of a niobium content of 53 mol %.

The aforedescribed detecting device was used and a titanium sapphire laser beam light was used to measure the phase matching wavelength of the output light beam emitted from the KLN single crystal with a precision of 0.05 nm by a photospectrum analyzer. The thus measured results was fed back to the pulling rate by using the controlling device computer. The controlling of the pulling rate changes depending on a time lag between the time of supplying the raw material powder and the time of complete melting of the raw material powder, factors resulting from evaporation, etc. of the raw material and other factors, such as shape of the crucible, and was substantially within a range of about 80±3 mm/hr.

The KLN single crystal plate was grown at a rate of 50 mm per about 40 min., so that it was cut to an every grown length of 50 mm by means of a carbon dioxide laser beam to continuously grow the single crystal plate of a size of 50 mm×50 mm×1 mm. By continuously operating for 10 days, 400 sheets of single crystal plates were produced.

Measurement of Properties as SHG Element

All the thus grown KLN single crystal plates were measured on wavelength as the SHG element. As a result, the phase matching wavelength was found to exist within a range of variation of ±0.2 nm for a target wavelength of 870 nm at every point within the single crystal plate and in any of the plates. The output light beam transforming efficiency was found to be substantially the same with the theoretical value, and the variation of the output light beam was within ±1% or less, which is smaller than detectable limit.

Comparative Example 1

The operation of Example 1 was repeated using the same apparatus as that of Example 1, except that the analyzing device for analyzing the SHG phase matching wavelength was not used and the single crystal fiber was continuously grown at a constant rate of 80 mm/hr. Though a single crystal of a phase matching wavelength of 870 nm was obtained initially, the phase matching wavelength was shifted with the elapse of time, and finally the niobium content in the melt in the crucible approached near 49 mol % and the phase matching wavelength was changed to around 840 nm.

Comparative Example 2

The operation of Example 2 was repeated using the same apparatus as that of Example 2 to prepare single crystal plates, except that the analyzing device for analyzing the SHG phase matching wavelength was not used and the single crystal was continuously grown at a constant rate of 80 mm/hr. As a result, even though the supply of the raw material powder was controlled as precisely as possible, the phase matching wavelength was varied within a range of 870±5 nm for the sake of the factors as described above.

EXAMPLE 3

The operation of Example 1 was repeated to grow a KLN single crystal, except that the melt composition and the pulling rate of the single crystal fiber were changed as shown in Table 1. As a result, the phase matching wavelength was varied as shown in Table 1 and as described above.

As explained in detail in the foregoings, when growing oxide-series single crystals by $\mu$ pulling down method, the composition of the single crystals can properly and quickly be controlled to continuously grow the single crystal of a constant composition according to the present invention.

Although the present invention has been explained with specific examples and numeral values, it is of course apparent to those skilled in the art that various changes and modifications thereof are possible without departing from the broad spirit and aspect of the present invention as defined in the appended claims.

What is claimed is:

1. A method for producing an oxide-series single crystal including a step of continuously pulling downwardly a melt of raw material of the oxide-series single crystal from a crucible containing the melt by $\mu$ pulling down method, comprising changing the pulling rate of the oxide-series single crystal to control the composition of the single crystal.

2. The method of claim 1, wherein the pulling rate of the oxide-series single crystal is changed in a range of 20–300 mm/hr.

3. The method of claim 1, wherein the pulling rate is so controlled that the composition of the single crystals becomes homogeneous in its growing direction.

4. The method of claim 1, wherein the pulling rate is decreased with the proceeding of growing of the single crystal.

5. The method of claim 1, wherein variation of composition of the grown single crystal is prevented by continuously or intermittently supplying a raw material of a same composition with the target composition of the single crystal with the proceeding of growing of the single crystal.

6. The method of claim 1, wherein a laser beam light is irradiated on the oxide-series single crystal, the output light beam emitted from the single crystal is measured, and the pulling rate is changed based on the measured value.

7. The method of claim 6, wherein the oxide-series single crystal is an oxide-series single crystal for a solid laser beam, a laser beam light is irradiated on the oxide-series single crystal, and the output light beam having a converted wavelength emitted from the single crystal is analyzed.

8. The method of claim 6, wherein the oxide-series single crystal has the second harmonic generation effect, a laser beam light is irradiated on the single crystal, and a second harmonic generation wave corresponding to the laser beam light emitted from the single crystal is analyzed.

9. An apparatus for continuously producing an oxide-series single crystal by $\mu$ pulling down method, comprising a crucible for receiving a melt of raw material of the oxide-series single crystal, a supplying device for supplying the raw materials in the crucible, a driving device for variably changing the pulling rate of the melt from the crucible to form the oxide-series single crystal and growing the single crystal, an analyzing device for analyzing a change of composition of the oxide-series single crystal under growing, and a treating device for changing the pulling rate of the single crystal by the driving device depending on the analyzed change of composition of the single crystal.

* * * * *